United States Patent [19]

Radice

[11] Patent Number: 4,843,275

[45] **Date of Patent: * Jun. 27, 1989**

[54] AIR BUOYANT PIEZOELECTRIC POLYMERIC FILM MICROPHONE

[75] Inventor: Peter F. Radice, Upper Merion, Pa.

[73] Assignee: Pennwalt Corporation, Philadelphia, Pa.

[ * ] Notice: The portion of the term of this patent subsequent to Jan. 20, 2004 has been disclaimed.

[21] Appl. No.: 145,454

[22] Filed: Jan. 19, 1988

[51] Int. Cl.[4] .............................................. H01L 41/08

[52] U.S. Cl. .................................... 310/334; 310/338; 310/339; 310/337; 310/800; 381/190

[58] Field of Search ................ 310/323, 328, 330–332, 310/338, 339, 334, 335, 337, 800; 381/190

[56] References Cited

U.S. PATENT DOCUMENTS

| | | | |
|---|---|---|---|
| 2,778,881 | 1/1957 | Fryklund | 179/110 |
| 2,834,952 | 5/1958 | Harris | 340/8 |
| 2,939,970 | 6/1960 | Dranetz et al. | 310/8.7 |
| 3,947,644 | 3/1976 | Uchikawa | 179/110 |
| 4,064,375 | 12/1977 | Russell et al. | 179/110 A |
| 4,166,229 | 8/1979 | DeReggi et al. | 310/337 |
| 4,284,921 | 8/1981 | Lemonon et al. | 310/328 |
| 4,488,873 | 12/1984 | Bloomfield et al. | 433/71 |
| 4,504,761 | 3/1985 | Triplett | 310/800 |
| 4,600,855 | 7/1986 | Strachan | 310/800 X |
| 4,638,207 | 1/1987 | Radice | 310/328 |
| 4,706,069 | 11/1987 | Tom et al. | 340/541 |
| 4,748,366 | 5/1988 | Taylor | 310/800 X |

FOREIGN PATENT DOCUMENTS 2120902 12/1983 United Kingdom .

OTHER PUBLICATIONS

J. F. Sear et al., "Noise-Cancelling Microphone Using a Piezoelectric Plastics Transducer Element," *Electronics Letter,* vol. 11, 1975.

D. Ricketts, "Model For a Compliant Tube Polymer Hydrophone," *J. Acoust. Soc. Am.,* vol. 79, No. 5, pp. 1603–1609, May 1986.

D. F. Stuart et al., *Handbook of Operational Amp Circuit Design,* Chapter 12, 1976.

"Speakers in the Air," *New Scientist,* p. 45, Jan. 7, 1988.

*Kynar® Piezo Film Technical Manual,* Pennwalt Corporation, Philadelphia, Pa., pp. 42–43, 1987.

*Primary Examiner*—Mark O. Budd

*Attorney, Agent, or Firm*—Bernard F. Plantz

[57] ABSTRACT

Piezoelectric polymer film, when conformably adhered to inner or outer surfaces of an inflated balloon, functions as a microphone when the pressure of sound waves causes the film to vibrate and generate an electrical signal. The film may be in the form of an helical strip, individual strips electrically serially connected, or may itself form the inflatable material. A receiving device is electrically coupled with the electrodes formed on the piezoelectric film for processing the electrical signals generated by the vibrating piezoelectric polymer film.

24 Claims, 4 Drawing Sheets

AIR BUOYANT PIEZOELECTRIC POLYMERIC FILM MICROPHONE

BACKGROUND OF THE INVENTION

This invention relates to piezoelectric polymeric films and, more particularly, concerns such films which function as a mobile microphone when strips or portions thereof are conformably secured to the surfaces of an inflated balloon, or the film itself is made to function as the inflated balloon. The electrodes disposed on the film are connected to a suitable receiving device for processing the electrical signal generated by the film.

Underwater acoustic transducers employing polymeric piezoelectric film materials are known. In British Pat. No. 2,120,902, a shell of PVDF material inflated with nitrogen is provided with the usual conductive coatings on each face thereof. When an alternating current of 100 cycles per second is applied to the coatings, the shell vibrates to act as an underwater sound generator. The British Patent also discloses that the device may be used as an underwater sound detector by processing electrical signals generated in the coatings on the PVDF shell.

In U.S. Pat. No. 2,939,970, a spherical microphone assembly includes spherical outer and inner electrodes with a spherical piezoelectric ceramic transducer element therebetween. The assembly may also be used as a loudspeaker.

In U.S. Pat. No. 4,284,921, various configurations, including hemispherical, of thermoformed piezoelectric polymeric film materials are disclosed as transducer elements for purposes of receiving and transmitting.

A need has developed for a microphone which is air buoyant, light in weight, maneuverable, and deflatable for easy storage and transport.

SUMMARY OF THE INVENTION

The apparatus of the present invention for receiving sound waves includes an air buoyant inflatable means inflated with a gas which is lighter in weight than air. A piezoelectric polymer film having electrodes on opposing sides thereof is attached to the air buoyant inflatable means. A receiving means for processing the electrical signal generated by the film when the film is caused to vibrate by the pressure of the received sound waves is electrically coupled with the electrodes disposed on the film.

A further embodiment of the present invention includes the fabrication of the air buoyant inflatable means from a piezoelectric polymer film which has electrodes disposed over both the outer and inner surfaces of the film. The air buoyant inflatable means is inflated with a gas which is lighter in weight than air and the electrodes are electrically coupled with a receiving means for processing the electrical signal generated by the film.

A still further embodiment of the present invention includes a means electrically coupled to the electrodes disposed on the piezoelectric film for producing an output signal when the waveform of the electrical signal generated by the film corresponds to a reference waveform.

DETAILED DESCRIPTION OF THE PREFERRED EMBODIMENTS

Generally, polymeric materials are non-piezoelectric. Polyvinylidene fluoride (PVDF or $PVF_2$) is approximately 50% crystalline and 50% amorphous. The principal crystalline forms of PVDF are the highly polar $\beta$ form and the non-polar $\alpha$ form. High piezo response is associated with the polar $\beta$ form. By carefully controlling process steps to polarize the film, including mechanical orientation and treatment in an intense electric field, a highly piezoelectric and pyroelectric film results. Such a film is commercially available under the trademark KYNAR®, a product of Pennwalt Corporation, Philadelphia, Pa., assignee of the present invention.

The procedure for poling is well known in the art and, in the case of dielectric polymer films, generally involves the application of a direct current voltage, e.g., 300 to 2000 kilovolts per centimeter of thickness of polymer film while first heating it to a temperature ranging between just above room temperature to just below the melting point of the film for a period of time and then, while maintaining the potential, cooling the film. Preferred systems for the continuous poling of piezoelectric (or pyroelectric) sensitive polymer film using a corona discharge to induce the piezoelectric charge are described in U.S. Pat. No., 4,392,178 and U.S. Pat. No. 4,365,283. The piezoelectric polymer films used in the present invention have a thickness in the range of between about 6 microns to about 110 microns and preferably between about 20 microns to about 50 microns.

The invention is not limited to films made of PVDF only, copolymers of vinylidene fluoride and trifluorethylene ($VF_2$–$VF_3$) and copolymers of vinylidene fluoride and tetrafluoroethylene ($VF_2$–$VF_4$), for example, may also be employed.

Figure 1:
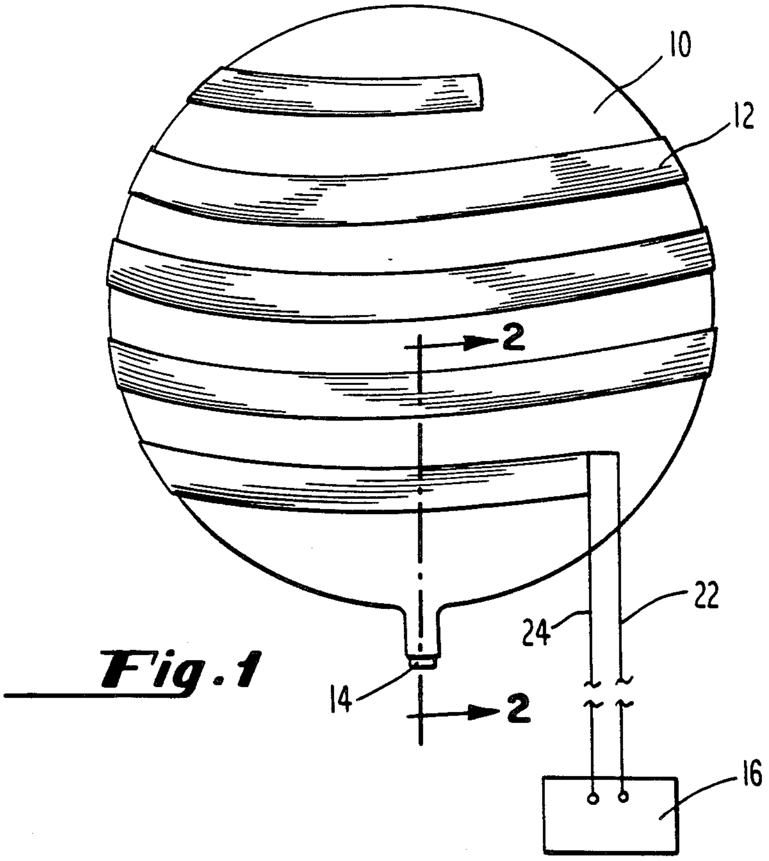
FIG. 1 is a perspective view, partially diagrammatic, of an embodiment of the present invention, illustrating an inflated balloon with a helical strip of the piezoelectric film secured therearound.

Referring now to FIG. 1, the inflated balloon 10 is provided with a helical strip 12 of piezoelectric polymeric film material, typically PVDF, secured therearound. When the piezoelectric polymer film surrounds the entire circumference of the inflated balloon 10, the device will function as an omnidirectional microphone. The balloon 10 is fabricated from rubber, polyester, nylon, or, preferably, a polyolefin-nylon laminate. The PVDF film may be suitably secured to the balloon 10 with double-sided tape, a pressure-sensitive spray adhesive, and the like.

The balloon 10 is inflated with a gas which is lighter in weight than air when it is to be used as an air buoyant microphone. Alternatively, if the balloon 10 is intended to float on water or not remain air buoyant, then it may be inflated with other gases, such as air. The stopper 14, typically rubber, allows the balloon 10 to remain inflated. Although the balloon 10 is shown with curved surfaces, it may be of any shape and size so long as it houses a sufficient volume of gas to remain airborne when it is to be used as an air buoyant microphone.

If the balloon 10 has a diameter of about 2 feet, then the helical strip 12 will typically be about 1 to 3 inches wide with similar spacings between turns. It is not intended that the helical strip 12 and spacings between turns be limited to the widths abovementioned since cost and quality considerations will normally dictate the total area of the piezoelectric PVDF film to be secured to any balloon, it being understood that the cost of the balloon will rise as the amount of PVDF film used thereon increases.

Figure 2:
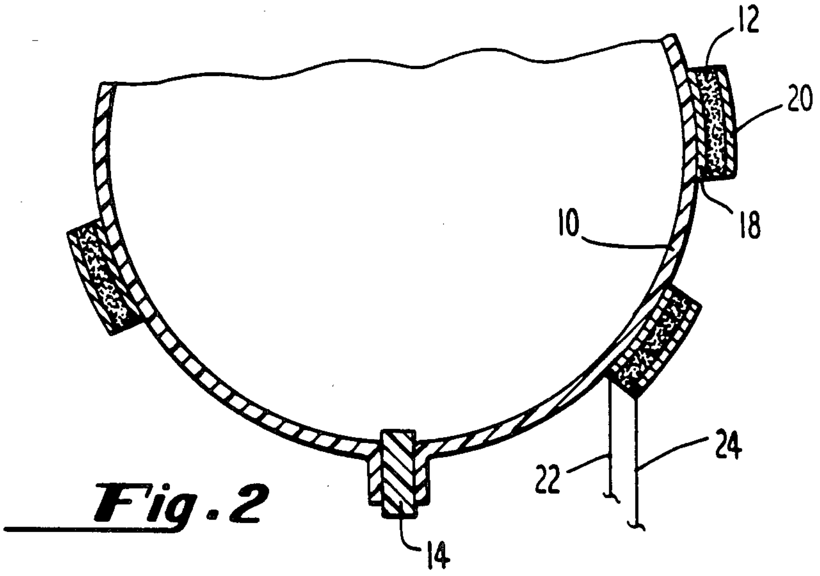
FIG. 2 is a sectional view of FIG. 1 taken along line 2—2 thereof.

Referring now to FIG. 2, the helical strip 12 of piezoelectric polymer film has an inner electrode 18 and an outer electrode 20. These electrodes 18 and 20 are deposited on the piezoelectric polymer film by a conventional silk screening process using a conductive ink, such as silver, nickel, copper or other conductive particles suspended in a suitable polymer matrix. The electrodes formed by the silk screening process have a thickness in the range of between about 3 to about 8 microns. The conductive material used for the electrodes may also be deposited on the piezoelectric polymer film using conventional vacuum deposition techniques. The vacuum deposited electrodes have a thickness in the range of between about 100 to about 800 Angstroms.

The inner and outer electrodes 18 and 20, respectively, are electrically coupled to a receiving device 16 via the conductors 22 and 24, respectively. The receiving device 16 processes the electrical signal which is generated when the pressure of the received sound wave causes the piezoelectric film to vibrate. The sound wave which may be received by the present invention is not limited to those frequencies which are detected by the human ear, but may also include subsonic and ultrasonic frequencies. Since the impedances of the piezoelectric polymer film and the electrical circuitry of the receiving device 16 may be mismatched, a conventional impedance matching circuit may be interposed between the receiving device 16 and the electrodes 18 and 20.

In those applications of the present invention where it would be desirable to have a wireless electrical coupling of the electrodes 18 and 20 and the receiving device 16, conventional r.f. transmitters and receivers may be employed. The generated electrical signal from the electrodes 18 and 20 would be modulated and supplied to an r.f. transmitter. The transmitted r.f. signal would be received by the r.f. receiver, demodulated and supplied to the receiving device 16 for processing of the generated electrical signal.

The receiving device 16, shown in FIG. 1, which processes the generated electrical signal, may be an amplifier with a speaker attached to the output so that amplified sound is produced. The receiving device 16 may also include a tape recorder or other recording device which will transfer the generated electrical signal to a recordable medium, such as magnetic tape, for storage and later playback purposes.

The receiving device 16 may include a circuit which detects the frequency of the generated electrical signal and generates an output signal when the frequency is of a preselected value or within a preselected range. This output signal would then be supplied to an alarm or other device for indicating that sound of a certain frequency has been detected. An example of a frequency detection circuit is a conventional bandpass filter, such as those described in Chapter 12 of the *Handbook of Operational Amp Circuit Design* by David F. Stuart and Milton Kaufman, McGraw-Hill Book Company (New York, 1976), which is hereby incorporated by reference.

When the piezoelectric polymer film is caused to vibrate by a particular sound, such by a jet airplane in flight, the generated electrical signal has a specific waveform. The receiving device 16 of the present invention may include a waveform recognition system which detects when the generated waveform corresponds to the waveform of a sound which has been previously stored in the system. For example, the waveform corresponding to the jet airplane in flight produced by the vibrating piezoelectric film would be stored in the waveform recognition system as a reference. The input of the waveform recognition system is then electrically coupled to the electrodes of the piezoelectric film mounted on the balloon of the present invention to analyze the waveforms which are produced when sound is detected. If the detected waveform corresponds to the reference waveform, an output signal is supplied to an alarm or other circuitry to indicate the presence of a jet airplane. An example of a suitable waveform detection system which may be used in the present invention is disclosed in U.S. Pat. No. 4,706,069 to Edward Tom et al., issued Nov. 10, 1987, which is hereby incorporated by reference. This patent also discloses filters and other components that may be used to electrically couple the system to a piezoelectric transducer.

Figure 3:
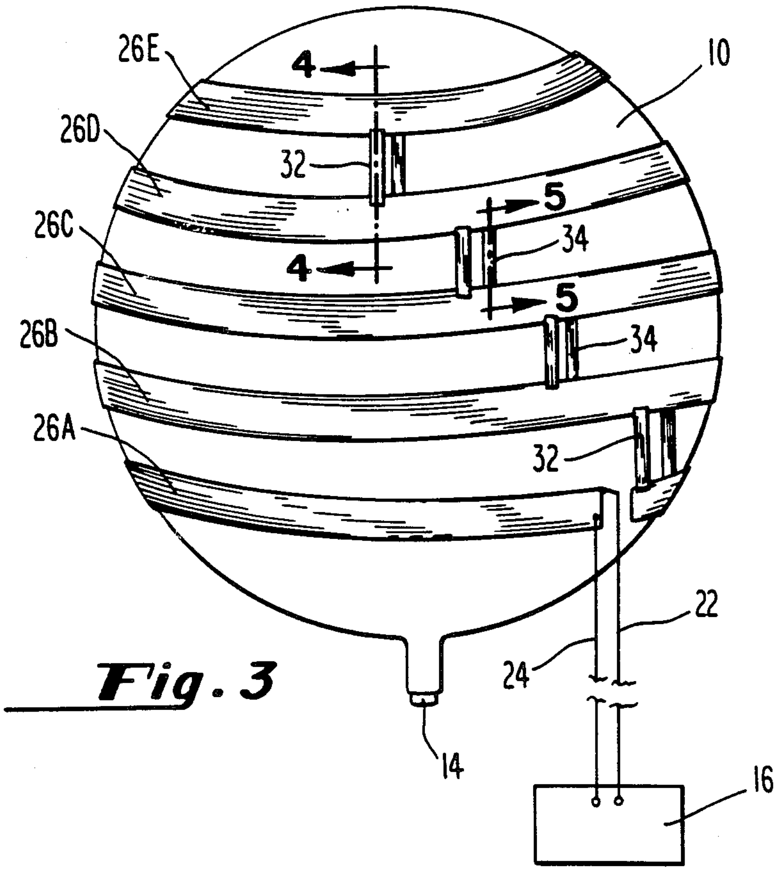
FIG. 3 is a view similar to FIG. 1, wherein the piezoelectric film comprises individual strips thereof.
Figure 4:
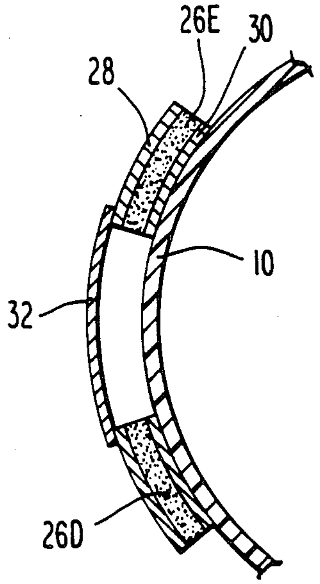
FIGS. 4 and 5 are sectional views of FIG. 3 taken along lines 4—4 and 5—5 respectively.
Figure 5:
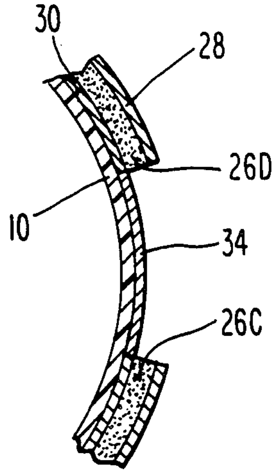

In FIGS. 3, 4 and 5, the piezoelectric polymer film may be identical to the helical strip 12 of FIG. 1, but in the form of individual strips 26A through 26E, for example. The strips 26A–26E will each have an outer electrode 28 and an inner electrode 30 electrically serially connected to its adjacent strip by means of connectors 32 and 34 respectively. The connectors 32 and 34 may comprise copper tape, Mylar® with conductive ink deposited thereon to provide an electrical connection, conductive adhesives, and the like. The electrical signal generated by the piezoelectric polymer strips 26A–26E are electrically coupled to the receiving device 16 by the conductors 22 and 24.

Figure 6:
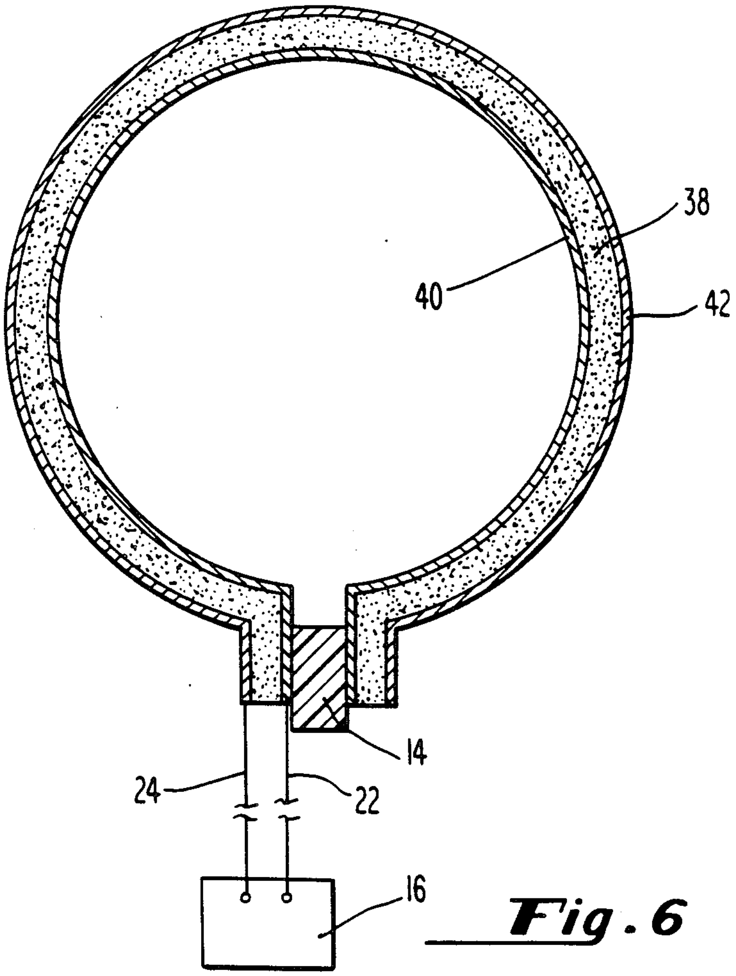
FIG. 6 is a sectional view, partially diagrammatic, of another embodiment of the present invention.

In FIG. 6, a piezoelectric polymer film 38 is used as the construction material for the balloon. The inner surface of the balloon is covered with an inner electrode 40, while the outer surface is covered with an outer electrode 42. The stopper 14 maintains the balloon in an inflated state. The inner and outer electrodes 40 and 42, respectively, are electrically coupled to the receiving device 16 via the conductors 22 and 24, respectively. Although not shown in FIG. 6, it may be desirable to fabricate only portions of the balloon from the piezoelectric polymer film.

Figure 7:
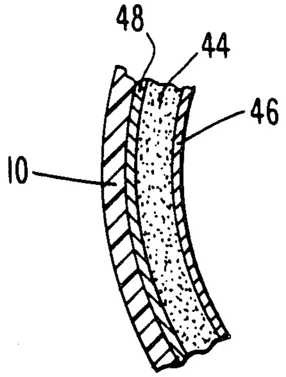
FIG. 7 is a fragmentary sectional view of yet another embodiment of the present invention.

In FIG. 7, the piezoelectric polymer film 44 with electrodes 46 and 48 is adheringly disposed on the interior of the balloon 10. The usual electrical connections to the receiving device 16 are made to the electrodes 46 and 48.

Fabrication of the microphone balloons of FIGS. 6 and 7 is within the skill of the balloon manufacturing art.

Figure 8:
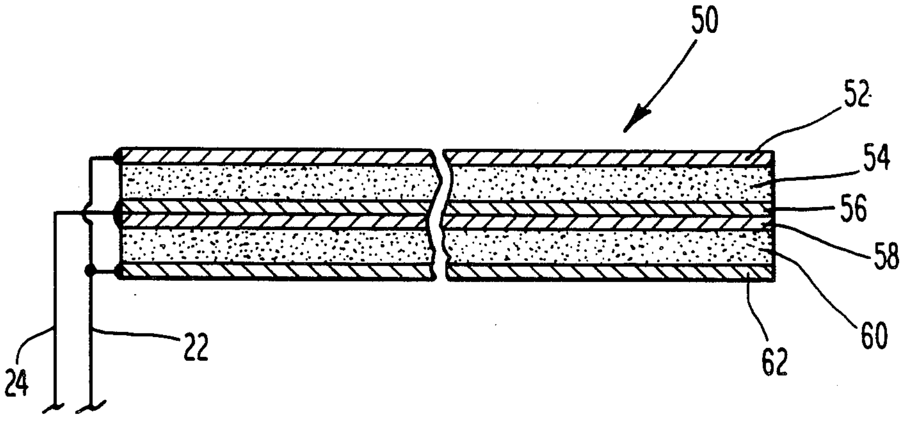
FIG. 8 is a fractional sectional view along the length of the piezoelectric film of a further embodiment of the present invention.

Referring now to FIG. 8, a further embodiment of the present invention employing a bimorph of piezoelectric polymer films is generally designated as 50. This bimorph 50 would be attached to the balloon 10 in the same fashion as the helical strips 12 in FIGS. 1 and 2 and the strips 26A–26E in FIGS. 3 to 5. The bimorph of piezoelectric polymer films 50 may also be used as the construction material for the balloon or it may be attached to the interior surfaces of a balloon in the same manner as described earlier for the single layer of piezoelectric polymer film shown in FIGS. 6 and 7, respectively. The bimorph 50 contains a first piezoelectric polymer film 54 with its associated electrodes 52 and 56 mounted in a stacked arrangement on a second piezoelectric polymer film 60 having electrodes 58 and 62. The two piezoelectric polymer films are held together by adhesively securing the electrodes 56 and 58. The outer electrodes 52 and 62 of the bimorph 50 are electrically connected to the conductor 22 with a conductive epoxy or other suitable connector. The inner electrodes 56 and 58 of the bimorph are electrically connected to the conductor 24 in a similar manner. If the conductor 22 is connected to ground, the piezoelectric films 54 and 60 are shielded from electromagnetic interference (E.M.I.) signals, such as 60-cycle fluorescent lamps, which may otherwise create unacceptable levels of background noise.

Figure 9:
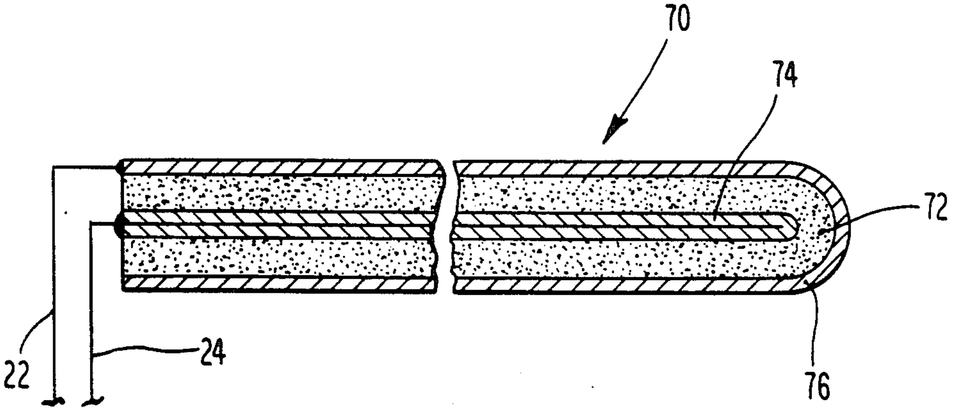
FIG. 9 is a fractional sectional view along the length of the piezoelectric film of a still further embodiment of the present invention.

Turning now to FIG. 9, a still further embodiment of the present invention generally designated as 70 employs a folded piezoelectric polymer film 72. The film 72 is folded in half along its width so that the electrode 74 is in a face-to-face relationship. The opposing portions of the electrode 74 are adhesively secured together and electrically connected to the conductor 24 with a conductive epoxy or other suitable connector. The electrode 76 is then electrically connected to the conductor 22 in a similar manner. The conductor 22 is then typically connected to ground so that the piezoelectric polymer film 72 is shielded from E.M.I. As described above with regard to FIG. 8, the folded piezoelectric film 72 would be attached to the balloon in the same fashion as the helical strips 12 in FIGS. 1 and 2, the strips 26A–26E in FIGS. 3 to 5, or the film 44 shown in FIG. 7.

The helical strips 12 shown in FIGS. 1 and 3 may be adhered to the curved surfaces of the balloon's interior. Furthermore, the helical strip 12 of piezoelectric polymer film need not have equal spacings between turns; nor is it required that the individual strips have equal spacings therebetween. The strips of film may be disposed asymmetrically around or within the balloon.

When the balloon is inflated with a gas which is lighter in weight than air, the present invention is particularly useful for surveillance purposes. Since the balloon would be air buoyant and mobile, it could be used to monitor sounds over large areas, such as prison grounds, warehouses, open fields and borders. The present invention can also be used to monitor bird migration as well as other air and land traffic. When the air buoyant microphone is coupled with a waveform recognition system, it can be used to identify the particular type of traffic, i.e. plane, helicopter or missile. The balloon, when inflated with air or other suitable gases, may be deployed from aircraft and allowed to float on water to monitor sounds during a search and rescue mission. Meteorological conditions may also be monitored with the present invention by detecting when rain, sleet or snow contacts the balloon or detecting the noise created when wind passes around the balloon.

I claim:

1. An apparatus for receiving sound waves, comprising:

a piezoelectric polymer film having electrodes disposed on opposing sides thereof;

air buoyant inflatable means with said film attached thereto for supporting said film in an air buoyant position, said inflatable means is filled with a gas which is lighter in weight than air; and receiving means electrically coupled with the electrodes of said film for processing the electrical signal generated by said film when said film is caused to vibrate by the pressure of the received sound waves.

2. An apparatus according to claim 1 wherein said piezoelectric polymer film is selected from the group consisting of polyvinylidene fluoride, copolymers of vinylidene fluoride and trifluoroethylene, and copolymers of vinylidene fluoride and tetrafluoroethylene.

3. An apparatus according to claim 1 wherein said air buoyant inflatable means is a balloon having outer surfaces with said film conformably adhering to said outer surfaces.

4. An apparatus according to claim 3 wherein said film comprises a helical strip.

5. An apparatus according to claim 1 wherein said air buoyant inflatable means is a balloon having inner surfaces with said film conformably adhering to said inner surfaces.

6. An apparatus according to claim 5 wherein said film comprises a helical strip.

7. An apparatus according to claim 1 wherein said film is a bimorph having grounded outer electrodes to shield against electromagnetic interference signals.

8. An apparatus according to claim 1 wherein said film is folded such that one of said electrodes is in a face-to-face relationship and the other of said electrodes is grounded to shield against electromagnetic interference signals.

9. An apparatus according to claim 1 wherein said film comprises individual strips thereof in a spaced distribution around said air buoyant inflatable means, said electrodes on said film comprising an outer electrode and inner electrode, and each of said individual strips having electrical connecting means for electrically coupling adjacent outer electrodes and adjacent inner electrodes.

10. An apparatus according to claim 1 wherein said receiving means comprises:

an amplifying means for amplifying the generated electrical signal; and means electrically coupled to the output of said amplifying means for producing amplified sound waves.

11. An apparatus according to claim 1 wherein said receiving means comprises:

a recording means for recording said electrical signal on a recordable medium.

12. An apparatus according to claim 1 wherein said receiving means comprises:

frequency selective means responsive to said electrical signal for detecting when the frequency of said electrical signal is within a preselected range and for generating an output signal in response thereto.

13. An apparatus according to claim 1 wherein said receiving means comprises:

means electrically coupled with said electrodes for producing an output signal when the waveform of the electrical signal generated by said film corresponds to a reference waveform.

14. An apparatus according to claim 13 wherein said receiving means further comprises:

indicating means responsive to said output signal for indicating that the waveform of the electrical signal generated by said film corresponds to the reference waveform.

15. An apparatus for receiving sound waves, comprising:

air buoyant inflatable means for housing gas and inflated with a gas which is lighter in weight than air, said air buoyant inflatable means comprises a piezoelectric polymer film having an outer electrode disposed over an outer surface of said film and an inner electrode disposed over an inner surface of said film; and receiving means electrically coupled with the electrodes of said film for processing the electrical signal generated by said film when said film is caused to vibrate by the pressure of the received sound waves.

16. An apparatus for receiving sound waves according to claim 15 wherein said piezoelectric polymer film is selected from the group consisting of polyvinylidene fluoride, copolymers of vinylidene fluoride and trifluoroethylene and copolymers of vinylidene fluoride and tetrafluoroethylene.

17. An apparatus according to claim 15 wherein said piezoelectric polymer film is a bimorph with the electrodes forming the outer and inner surfaces of said inflatable means grounded to shield against electromagnetic interference signals.

18. An apparatus according to claim 15 wherein said receiving means comprises:

an amplifying means for amplifying the generated electrical signal; and means electrically coupled to the output of said amplifying means for producing amplified sound waves.

19. An apparatus according to claim 15 wherein said receiving means comprises:

a recording means for recording said electrical signal on a recordable medium.

20. An apparatus according to claim 15 wherein said receiving means comprises:

frequency selective means response to said electrical signal for detecting when the frequency of said electrical signal is within a preselected range and for generating an output signal in response thereto.

21. An apparatus according to claim 15 wherein said receiving means comprises:

means electrically coupled with said electrodes for producing an output signal when the waveform of the electrical signal generated by said film corresponds to a reference waveform.

22. An apparatus according to claim 21 wherein said receiving means further comprises:

indicating means responsive to said output signal for indicating that the waveform of the electrical signal generated by said film corresponds to the reference waveform.

23. An apparatus for receiving sound waves, comprising:

an inflatable means for housing gas;

a piezoelectric polymer film having electrodes on opposing sides thereof attached to said inflatable means, said piezoelectric polymer film generating an electrical signal when said film is caused to vibrate by the pressure of the received sound waves;

means electrically coupled with said electrodes for producing an output signal when the waveform of the electrical signal generated by said film corresponds to a reference waveform; and indicating means responsive to said output signal for indicating that the waveform of the electrical signal generated by said film corresponds to the reference waveform.

24. An apparatus for receiving sound waves, comprising:

inflatable means for housing gas comprising a piezoelectric polymer film having an outer electrode disposed over an outer surface of said film and an inner electrode disposed over an inner surface of said film, said film generating an electrical signal when it is caused to vibrate by the pressure of the received sound waves;

means electrically coupled with said electrodes for producing an output signal when the waveform of the electrical signal generated by said film corresponds to a reference waveform; and indicating means responsive to said output signal for indicating that the waveform of the electrical signal generated by said film corresponds to the reference waveform.

* * * * *